United States Patent [19]

Mizutani et al.

[11] Patent Number: 4,754,320

[45] Date of Patent: Jun. 28, 1988

[54] EEPROM WITH SIDEWALL CONTROL GATE

[75] Inventors: Yoshihisa Mizutani, Tokyo; Susumu Kohyama, Kawasaki; Koji Makita, Yokohama, all of Japan

[73] Assignee: Kabushiki Kaisha Toshiba, Kawasaki, Japan

[21] Appl. No.: 832,580

[22] Filed: Feb. 24, 1986

[30] Foreign Application Priority Data

Feb. 25, 1985 [JP] Japan ............................ 60-35678
Sep. 19, 1985 [JP] Japan ............................ 60-207001
Sep. 26, 1985 [JP] Japan ............................ 60-212873

[51] Int. Cl.⁴ .................. H01L 29/78; H01L 29/44
[52] U.S. Cl. .................. 357/23.5; 357/41; 357/51; 357/23.3; 357/23.14; 365/185
[58] Field of Search .......... 357/23.5, 51, 41, 23.5, 357/23.3, 23.14; 365/185

[56] References Cited

U.S. PATENT DOCUMENTS 4,462,090  7/1984  Iizuka ............................ 357/23.5

FOREIGN PATENT DOCUMENTS 55-154772 12/1980  Japan ............................ 357/23.5
57-76878   5/1982  Japan ............................ 357/23.5
58-54668   3/1983  Japan ............................ 357/23.5
59-33881   2/1984  Japan ............................ 357/23.5
59-126674  7/1984  Japan ............................ 357/23.5
2080024    1/1982  United Kingdom ............ 357/23.5

OTHER PUBLICATIONS

Mizutani et al., "A New EPROM ... Device", IEDM, Dec. 1985, pp. 635–637.
Verwy & Kramer, "ATMOS ... Device", IEEE Trans. on Elec. Dev., vol. ED-21, No. 10, Oct. 74, pp. 631–635.
Patent Abstracts of Japan, vol. 2, No. 120, Oct. 6, 1978, p. 7046 E78 (Japan Patent Office, Tokyo).
Patent Abstracts of Japan, vol. 6, No. 264, Dec. 23, 1982, 1142 E150 (Japan Patent Office, Tokyo).

*Primary Examiner*—Andrew J. James
*Assistant Examiner*—Jerome Jackson, Jr.
*Attorney, Agent, or Firm*—Finnegan, Henderson, Farabow, Garrett and Dunner

[57] ABSTRACT

A semiconductor device, and more particularly, an erasable programmable read only memory has a control gate electrode and a floating gate electrode. The floating gate electrode is formed on one side wall of the control gate electrode through an insulating film.

6 Claims, 9 Drawing Sheets

F I G. 4
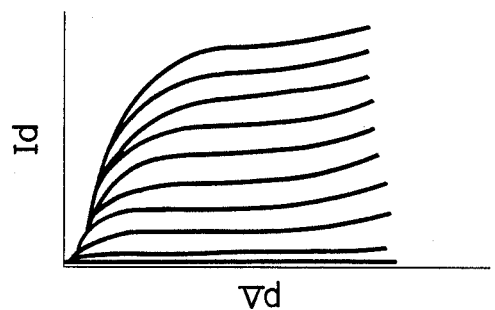
F I G. 5
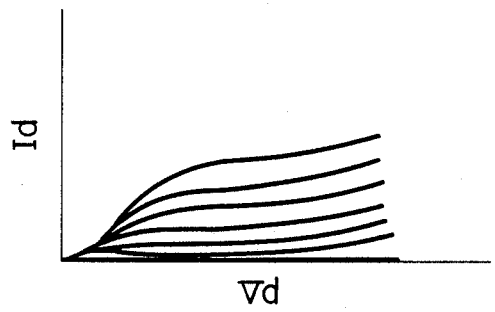
F I G. 6
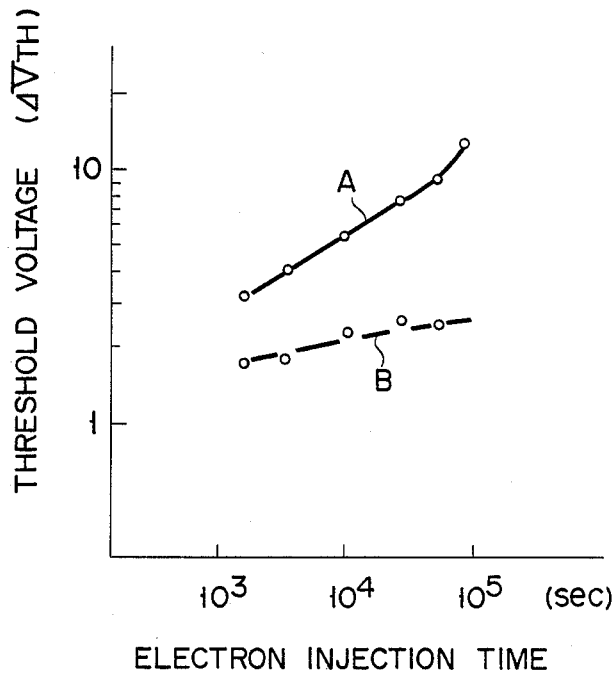

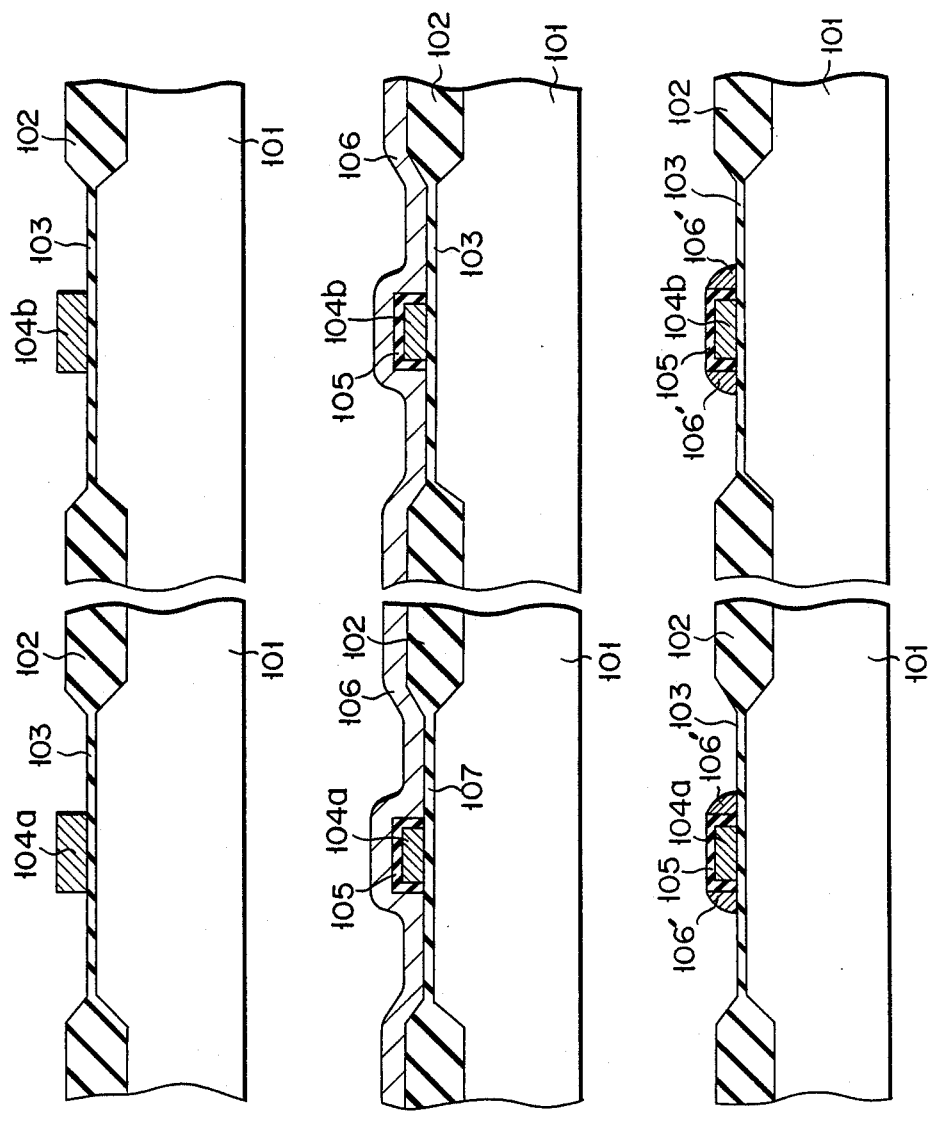

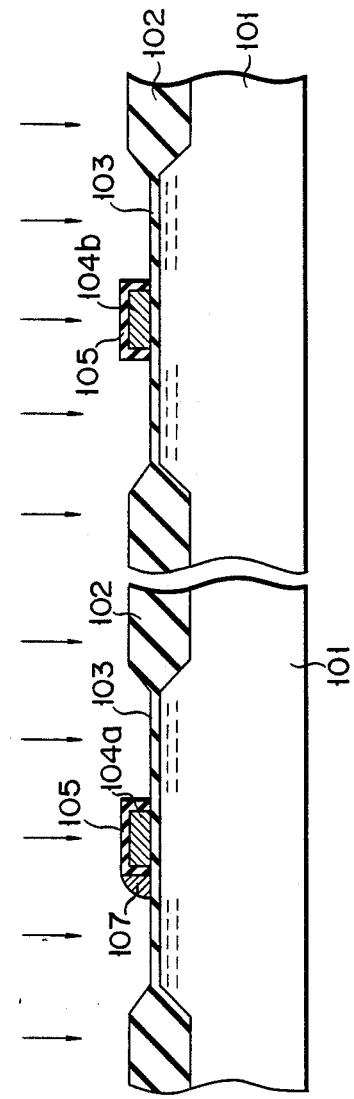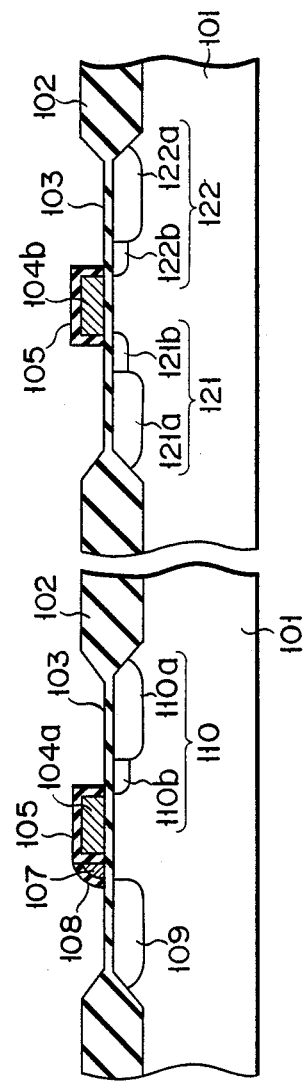
FIG. IIF
FIG. IIG

EEPROM WITH SIDEWALL CONTROL GATE

BACKGROUND OF THE INVENTION

I. Field of the Invention

The present invention relates to a semiconductor device and, more particularly, to a semiconductor device for use as a memory cell in an erasable programmable read only memory (EPROM) which has a floating gate and a control gate.

II. Description of the Prior Art

In conventional EPROM memory cells, a structure of the type shown in FIG. 1 is known. In FIG. 1, reference numeral 1 denotes a monocrystalline silicon substrate; 2, a field insulating film; 3 and 4, n+-type source and drain regions formed apart from each other in the surface region of substrate 1; 5, a gate insulating film; 6, a floating gate formed on top of gate insulating film 5; 7, an insulating film formed on top of floating gate 6; 8, a control gate formed on top of insulating film 7; 9, a source electrode; 10, a drain electrode; and 11, an insulating film.

Information is written in a memory cell having the construction shown in FIG. 1 in the following manner. When a high voltage of, for example, +20 V or more is applied to drain electrode 10 and control gate 8 at the same time, electrons flow from source region 3 to drain region 4 and can cause the impact ionization (avalanche) phenomenon near drain region 4. Some of the electrons of the electron-hole pairs generated here pass through gate insulating film 5 and are injected into floating gate 6, where they are trapped.

When information has been written to the cell, the threshold voltage $V_{TH}$ is increased because of the electrons trapped in floating gate 6, and even if a read voltage is applied to control gate 8, the memory cell will not go ON. On the other hand, when information has not been written to the cell, i.e., when no electrons are trapped in gate 6, the threshold voltage is low and the cell will easily go ON if a read voltage is applied to the control gate.

As a result, with this type of memory cell it is possible to determine whether information has been written to the cell or not. It is also possible to erase already written information with ultraviolet rays and rewrite new information after erasure.

At present in the field of semiconductor devices, progress in element micropatterning technology is eye-opening, the reduction of channel length are particularly notable in order to increase the switching speed. In the area of EPROMs also, this reduction of memory cell channel length is proceeding rapidly.

In EPROMs, however, a significant problem has arisen along with the reduction of channel length. As channel length decreases, the electric field created in the channel region by the voltage applied between the source and the drain becomes stronger. As a result, even when a comparatively low voltage (about +5 V) used for EPROM readout is applied to the drain and gate, the electrons flowing from the source region to the drain region are accelerated by the strong electric field in the channel region and are able to obtain enough energy to cause the above-mentioned impact ionization in the portion of the channel region near the drain. When information readout is performed in EPROMs whose channel length has been reduced for the purpose of high integration, electrons are also trapped in the floating gate electrodes of memory cells not containing any information, thus making those cells impossible to distinguish from those actually containing information. This phenomenon is usually referred to as unintentional writing. In a highly integrated memory cell having the structure shown in FIG. 1, the unintentional writing can be prevented only by reducing the source voltage. As the source voltage drops, however, the speed of information readout become very slow.

SUMMARY OF THE INVENTION

It is an object of the present invention to provide a semiconductor device for use in a memory cell which has a high switching speed, eliminates unintentional writing, and reduces the voltage that must be applied during the write operation.

It is another object of the present invention to provide a method of manufacturing the above semiconductor device.

According to the first embodiment of the present invention, there is provided a semiconductor device, comprising: semiconductor substrate of a first conductivity type; a first impurity diffusion region of a second conductivity type, formed in a surface region of the semiconductor substrate; a second impurity diffusion region of the second conductivity type, formed in the surface region of the semiconductor substrate and separated from the first impurity diffusion region; a first insulating film formed on the surface of the semiconductor substrate; and a floating gate electrode and a control gate electrode formed on a portion of the first insulating film corresponding to a portion of the semiconductor substrate lying between the first and second impurity diffusion regions such that the floating gate electrode and the control gate electrode sandwich a second insulating film therebetween; wherein the floating gate electrode is positioned near the first impurity diffusion region, and the control gate electrode is positioned near the second impurity diffusion region.

The semiconductor device of the present invention can be applied to the memory cell of an EPROM. In this case, the first impurity region is used as a drain region during the write operation and as a source region during the read operation. The second impurity diffusion region is used as a source region during the write operation and as a drain region during the read operation.

With the first embodiment of the present invention, it is possible to obtain a semiconductor device for use in a memory cell which has a high switching speed, eliminates unintentional writing, and reduces the voltage that must be applied during the write operation.

According to a second embodiment of the present invention, there is provided a method of manufacturing a semiconductor device, comprising the steps of:

forming a first insulating film on a semiconductor substrate of a first conductivity type;

forming a control gate electrode on the first insulating film;

forming a second insulating film on a surface of the control gate electrode;

depositing a conductive material over the entire surface of the resultant structure to form a conductive material layer;

performing anisotropic etching of the conductive material layer to remove all of the conductive material layer except those portions corresponding to the side walls of the control gate electrode;

selectively removing a portion of the residual conductive material layer such that the residual material layer remains only on one of the side walls of the control gate electrode, and forming a floating gate electrode consisting of the remaining portion of the residual conductive material layer; and introducing an impurity of the second conductivity type into the semiconductor substrate using the control gate electrode and the floating gate electrode as masks to form first and second impurity diffusion regions in a surface region of the semiconductor substrate.

The method of the present invention is particularly effective when applied to the case where a memory cell and a MOS transistor are formed together on the same substrate.

BRIEF DESCRIPTION OF THE DRAWINGS

FIGS. 4 to 6 are graphs showing characteristics of a memory cell obtained in Example 1 of the present invention;

FIGS. 11A to 11H are sectional views showing steps in the formation of an EPROM memory cell and a MOS transistor together on the same substrate.

DETAILED DESCRIPTION OF THE PREFERRED EMBODIMENTS

Various examples in which the present invention was applied to an EPROM memory cell will now be described with reference to the accompanying drawings below.

EXAMPLE 1

FIGS. 2A to 2G are plan views showing steps in the manufacture of an EPROM memory cell, and FIGS. 3A to 3G are sectional views corresponding thereto.

Figure 1:
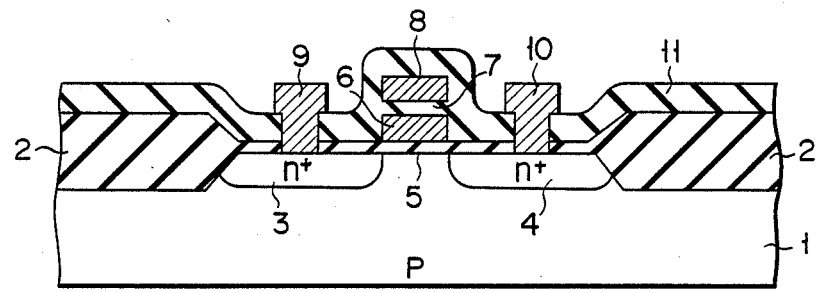
FIG. 1 is a sectional view of the structure of a conventional EPROM memory cell.
Figure 2A:
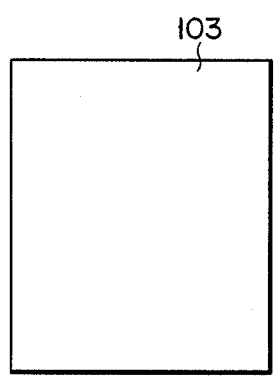
FIGS. 2A to 2G are plan views showing steps in the manufacture of an EPROM memory cell in Example 1 of the present invention.
Figure 2B:
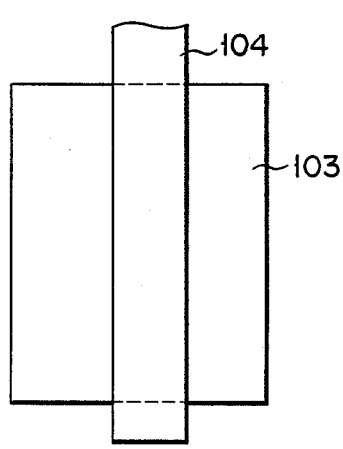
Figure 3A:
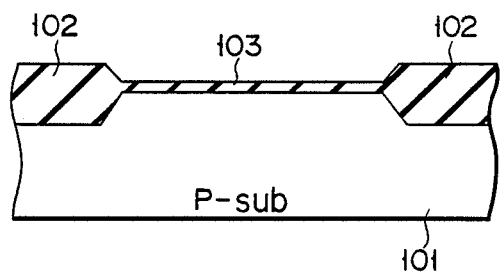
FIGS. 3A to 3G are sectional views corresponding to the plan views of FIGS. 2A to 2G.
Figure 3B:
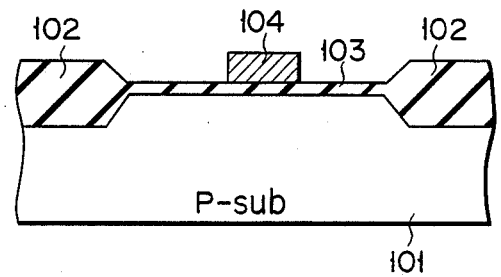

First, selective oxidation was performed on p-type silicon substrate 101, and field oxide film 102 was formed on substrate 101 to constitute an element formation island region. Thermal oxidation was performed at a temperature of 900° to 1000° C. in an oxidizing atmosphere to form 250-Å thick oxide film 103 on the island region of substrate 101 (FIGS. 2A and 3A). A 3000-Å thick polycrystalline silicon film doped with either an n- or p-type impurity was then deposited over the entire surface of the resultant structure using a low-pressure CVD method and patterned to form control gate 104, consisting of polycrystalline silicon (FIGS. 2B and 3B).

Figure 2C:
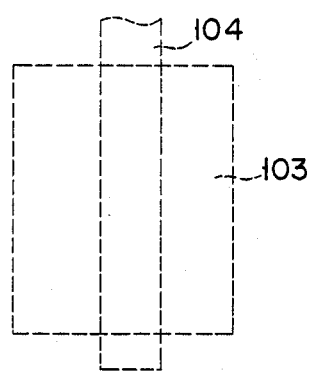
Figure 3C:
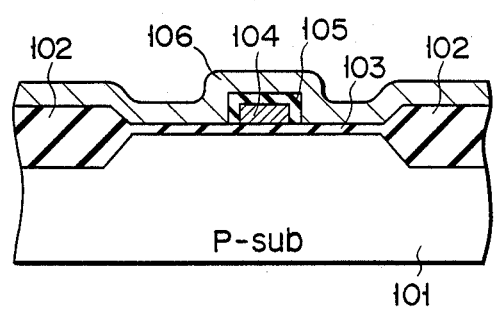
Figure 2D:
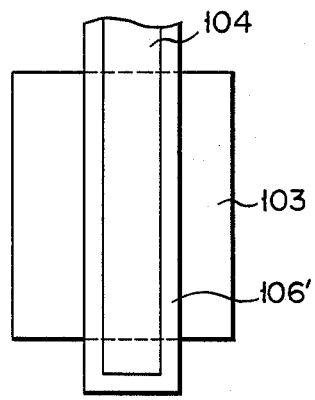
Figure 3D:
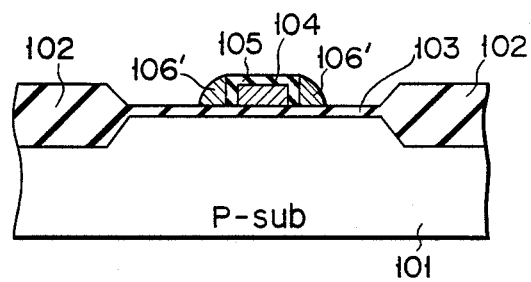

500-Å thick oxide film 105 was grown by thermal oxidation on the surface of control gate 104 at a temperature of 900° to 1000° C. in an oxidizing atmosphere, and 3500-Å thick polycrystalline silicon film 106 doped with either an n- or p-type impurity was deposited over the entire surface of the resultant structure using a low-pressure CVD method (FIGS. 2C and 3C). A constant thickness of film 106 was then removed using an anisotropic etching method such as RIE. In this step, since portions 106' of film 106 formed on the side walls of control gate 104 through film 105 have a greater thickness in the vertical direction than other portions, portions 106' are left although other portions are removed (FIGS. 2D and 3D).

Figure 2E:
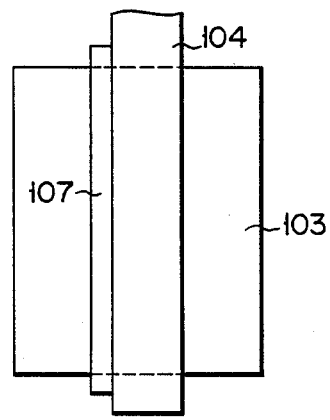
Figure 3E:
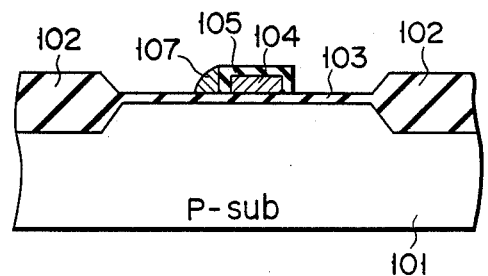

Residual polysilicon portion 106' lying on one side wall of control gate 104 was then removed using as a mask a photoresist pattern (not shown) formed by photolithography. Polysilicon portion 106' on the other side wall of control gate 104 was retained as floating gate 107 (FIGS. 2E and 3E).

Figure 2F:
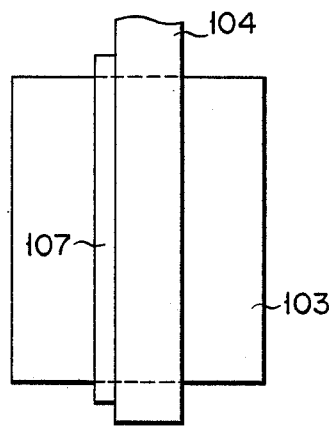
Figure 3F:
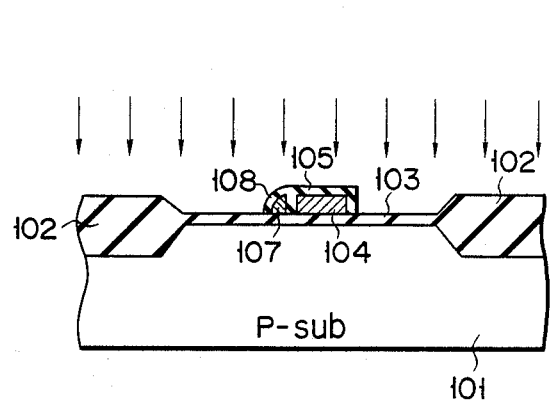

Oxide film 108 was grown by thermal oxidation to a thickness of 500 Å on the surface of floating gate 107 at a temperature of 900° to 1000° C. in an oxidizing atmosphere. An n-type impurity such as arsenic was then ion-implanted at an acceleration voltage of 50 keV and a dose of $1 \times 10^{15}$ cm$^{-2}$, using film 102, control gate 104, and floating gate 107 as masks (FIGS. 2F and 3F). Annealing was performed to activate the implanted arsenic ions and form n$^+$-type impurity diffusion layers 109 and 110. After depositing SiO$_2$ film 111 to cover the entire surface and opening contact holes 112, an Al film was deposited and patterned to form Al electrodes 113 and 114, thereby completing an EPROM memory cell (FIGS. 2G and 3G).

Figure 2G:
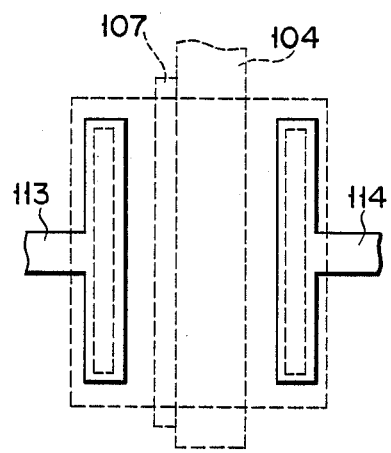
Figure 3G:
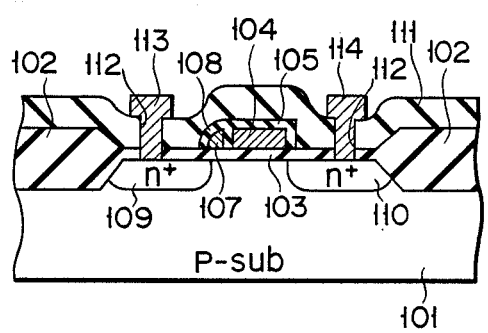

In the EPROM memory cell of the present invention, regions 109 and 110 serving as source and drain regions on the surface of the island region of p-type silicon substrate 101 which is isolated by film 102, are formed to be separated from each other, as shown in FIGS. 2G and 3G. Control gate 104 and floating gate 107 are formed on film 103, located above top of the channel region of substrate 101 between regions 109 and 110, and gates 104 and 107 are insulated from each other by film 105 sandwiched therebetween.

During the write operation in a memory cell having this kind of structure, regions 109 and 110 are used as drain and source regions, respectively. More specifically, electrodes 113 and 114 serve as drain and source electrodes, respectively, and a high voltage is applied to both drain electrode 113 and control gate 104. In this case, the potential in the channel region is equal or nearly equal to the potential of the source region, i.e. region 110. Thus the electric field between the source and drain regions concentrates and becomes stronger in the channel region near region 109 (drain region), and the generation of hot carriers (electron-hole pairs) occurs in this area due to impact ionization and the injection of electrons into floating gate 107, thus carrying out the write operation.

During the read operation, region 109 serves as a source region, and region 110 serves as a drain region. More specifically, electrodes 113 and 114 serve as source and drain electrodes, respectively, and a suitable voltage (e.g., 5 V) is applied between the source and drain. In addition, a suitable voltage (e.g., +5 V) is applied to control gate 104 to check for changes in characteristics such as threshold voltages $V_{TH}$ of cells with information and those without information, thus allowing the readout of information. In this case also, since the electric field between the source and drain regions is concentrated and becomes stronger in the channel region near region 110 (drain region), hot carriers can be generated in this area. However, since the floating gate is not present near the area where the hot carriers are generated, the carriers are not injected in the floating gate and unintentional writing can be prevented.

As described above, in a memory cell having the structure of the present invention, there is no fear of unintentional writing during the read operation, and hence it is possible to make the channel length satisfactorily short. As a result, the efficiency of the write operation can be increased, and the write voltages necessary for the drain, control gate, and the like can be made smaller than in conventional devices. The voltages applied during the write and read operations can both be set at, for example, 5 V.

FIGS. 4 and 5 are graphs showing the results of measuring the relation between drain voltage ($V_d$) and drain current ($I_d$) with gate voltage as a parameter when regions 109 and 110 are used as source and drain regions, respectively. FIG. 4 shows the case where electrons have not been injected in floating gate 107; FIG. 5 shows the case where they have been injected.

A comparison of the graphs shows that when electrons are injected in gate 107 (FIG. 5), transconductance and drain current are lower than when electrons are not injected (FIG. 4).

The following advantages can be obtained when the n+-type diffusion region on the side of the floating gate is used as a source region and the other diffusion region is used as a drain region during the read operation in the structure shown in FIGS. 2G and 3G. The influence of the charge stored in the floating gate on cell characteristics is clearly larger than when the gate is on the drain side instead of the source side. When a charge is injected in the floating gate of the memory cell of the present invention, the change in threshold voltage as a function of injection time can be obtained, as shown in FIG. 6. Curve B shows the results of measurement when electrodes 114 and 113 were used as source and drain electrodes, respectively. Curve A shows the results of measurement when electrodes 114 and 113 were used as drain and source electrodes, respectively. Even though the injected charge was the same, the change in threshold voltage was larger when the floating gate was on the source side.

In the above embodiment, ion implantation was performed after oxidizing the surface of gate 107 (FIGS. 2F and 3F). It is also possible to perform thermal oxidation of the area around gate 107 after ion implantation. This method performs the dual functions of oxidation and the activation of ion-implanted impurities, which previously required two annealing processes.

EXAMPLE 2

Figure 7:
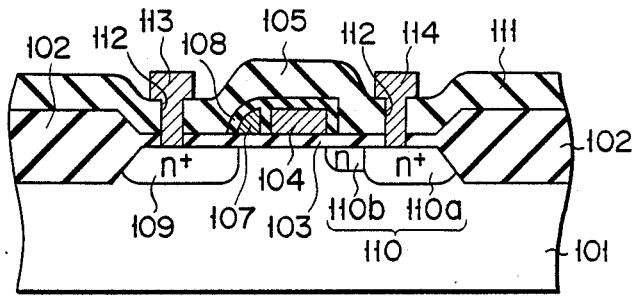
FIG. 7 is a sectional view of an EPROM memory cell obtained in Example 2 of the present invention.

The memory cell in FIG. 7 is constructed such that diffusion region 110, forming a drain region during the read operation, consists of high concentration region 110a and low concentration region 110b. The latter is formed to be connected to the channel region. During the write operation in a memory cell having this structure, electrodes 113 and 114 are used as drain and source electrodes, respectively, just as in the example shown in FIGS. 2G and 3G. During the read operation, electrodes 113 and 114 are used as source and drain electrodes, respectively. A suitable voltage is applied between the source and drain and also to control gate 104. Since the low impurity concentration region 110b of region 110 is connected to the channel region, some of the voltage components applied between source and drain can be applied there (in region 110b). As a result, in the memory cell shown in FIG. 11, the generation of hot carriers near the drain region during the read operation can be controlled more effectively, and the unintentional writing can be prevented.

EXAMPLE 3

Figure 8:
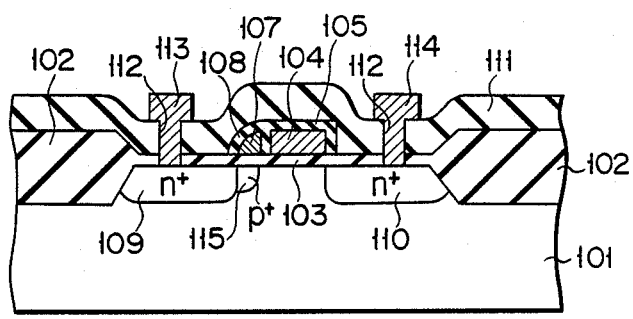
FIG. 8 is a sectional view of an EPROM memory cell obtained in Example 3 of the present invention.

The memory cell in FIG. 8 is constructed with p+-type diffusion region 115, which has the same conductivity type as but a higher impurity concentration than substrate 101, Region 115 is formed adjacent to region 109, which is of two regions 109 and 110 the closer to the floating gate. This type of structure makes it possible to increase the efficiency of the write operation. When the write operation is performed using regions 109 and 110 as drain and source regions, respectively, the concentration of the electric field in the portion of region 115 and hence impact ionization in this portion tends to occur, thus increasing write efficiency. When the read operation is performed, regions 109 and 110 are used as source and drain regions, respectively. Region 115 is adjacent to region (source) 109, so the influence on read characteristics is almost nil, and there is no fear of the unintentional writing.

EXAMPLE 4

Figure 9:
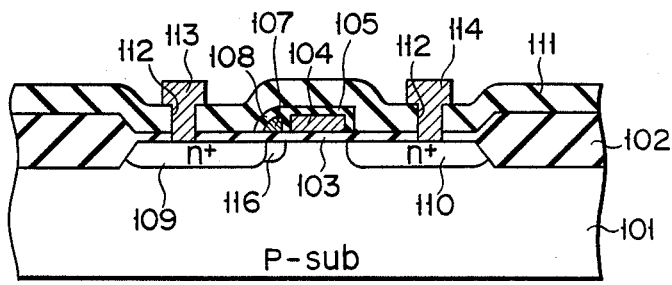
FIG. 9 is a sectional view of an EPROM memory cell obtained in Example 4 of the present invention.

The memory cell in FIG. 9 was constructed with a region 116, formed by doping an n-type impurity in the portion of the channel region below floating gate 107. n-type impurity concentration of region 116 is higher than that of other portions of the channel region, though it must be lower than that of region 109.

The implantation of an n-type impurity to form region 116 was performed after the formation of control gate 104 in the step shown in FIGS. 2B and 3B of Example 1 using control gate 104 as a mask.

In a memory cell of the structure shown in FIG. 9, an n-type impurity is doped in the channel region below floating gate 107, which is positioned near (drain) region 109. Since the impurity concentration is greatly lower than that of region 109, a depletion layer can be formed therein. During the write operation, therefore, the generation of hot carriers by impact ionization is not interfered with, and the resultant electrons can be freely injected in gate 107.

During the read operation, when no charge is stored in gate 107, it is possible to accelerate the inversion of the channel region below gate 107 by applying a voltage of the previously specified value to gate 104. As a result, the value of the electric current flowing in cells not containing information becomes large enough to allow easy determination of which cells do contain information and which cells do not.

The n-type impurity doped in the channel region below gate 107 can thus be used to increase the value of the electric current in cells not containing information. However, when the impurity concentration is too high, there is the possiblity that the current cutoff by the floating gate in cells containing information will be interrupted. Therefore, it is necessary to set the concentration of the doped impurity at a level which will not interfere with current cutoff by the floating gate of the cell containing information.

EXAMPLE 5

Figure 10:
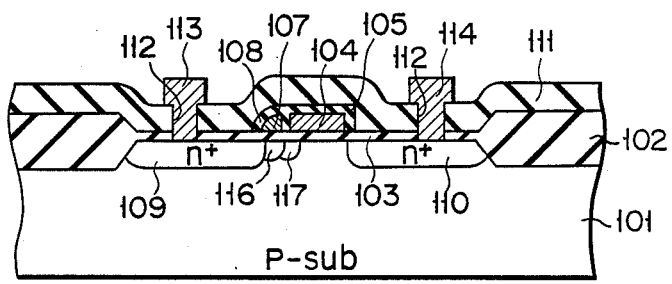
FIG. 10 is a sectional view of an EPROM memory cell obtained in Example 5 of the present invention.

FIG. 10 shows a memory cell constructed with p+-type region 117, formed adjacent to n-type impurity doped region 116. With region 117 it is possible to stop the spread of the depletion layer formed by region 116.

EXAMPLE 6

FIGS. 11A to 11H show steps in the manufacture of the EPROM shown in Example 3 together with a MOS transistor having an LDD (lightly doped drain) structure.

First, selective oxidation was performed on p-type silicon substrate 101, and field oxide film 102 was formed on the surface of substrate 101 to constitute an element formation island region. Thermal oxidation was performed at a temperature of 900° to 1000° C. in an oxidizing atmosphere to form 250-Å thick oxide film 103 on the island region of substrate 101. A 3000-Å thick polycrystalline silicon film doped with either an n- or p-type impurity was then deposited over the entire surface of the resultant structure using a low-pressure CVD method and patterned to form control gate electrode 104a and gate electrode 104b, both of which consist of polycrystalline silicon (FIG. 11A).

500-Å thick oxide film 105 was then grown by thermal oxidation on the surface of electrodes 104a and 104b at a temperature of 900° to 1000° C. in an oxygen atmosphere. 3500-Å thick polycrystalline silicon film 106, doped with either an n- or p-type impurity, was deposited over the entire surface of the resultant structure using a low-pressure CVD method (FIG. 11B), and a constant thickness of film 106 was removed using an anisotropic etching method such as RIE. Since the film thickness in the vertical direction of the areas around electrodes 104a and 104b is greater than that of other areas, polysilicon 106' was left (FIG. 11C).

Figure 11D:
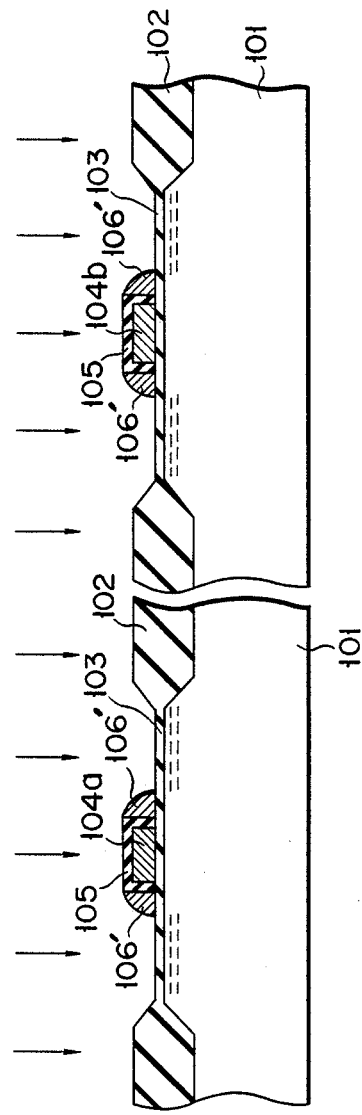
Figure 11E:
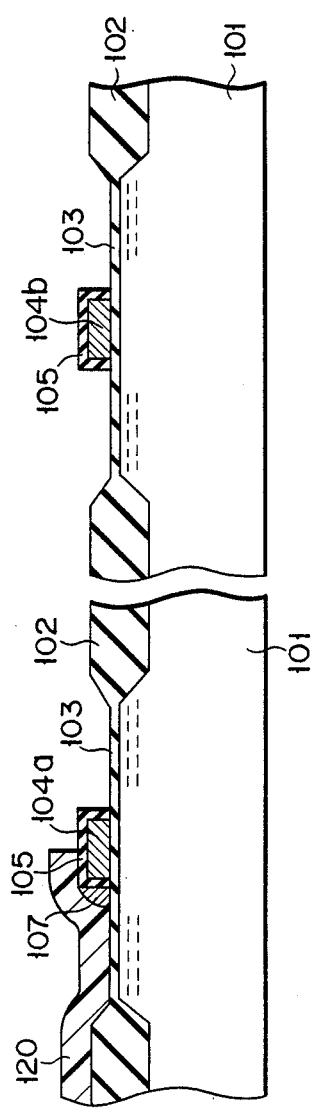

An n-type impurity such as arsenic was then ionimplanted in the surface of substrate 101 at an acceleration voltage of 50 keV and a dose of $1 \times 10^{15}$ cm$^{-2}$, using film 102, electrodes 104a and 104b, and polysilicon 106' as masks (FIG. 11D). Polysilicon 106' was selectively etched using photoresist pattern 120, formed by photoetching, to form floating gate electrode 107 on one side of electrode 104a such that it occupies a position only on the peripheral of the element region (FIG. 11E).

Figure 11H:
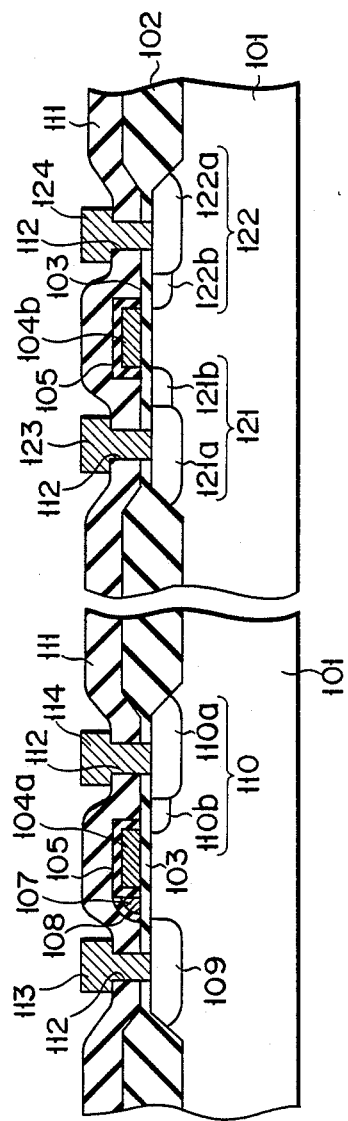
Figure 12:
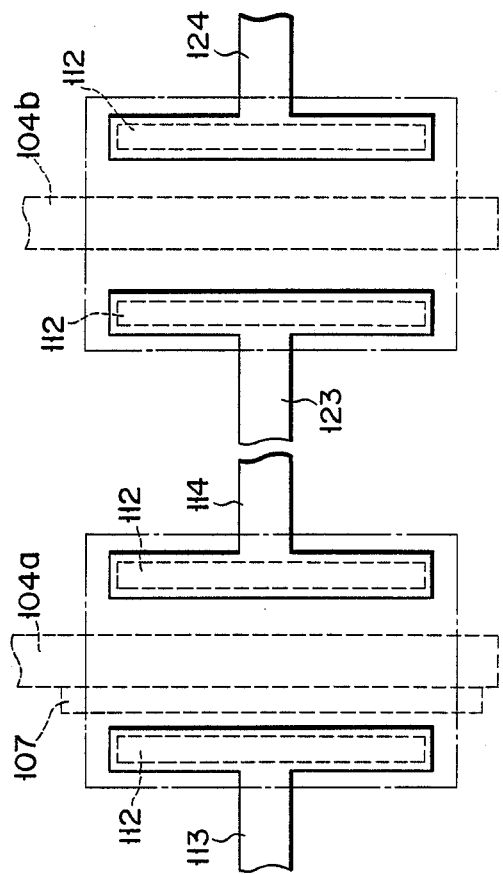
FIG. 12 is a plan view corresponding to the sectional view of FIG. 11H.

After removing pattern 120, an n-type impurity such as phosphorous was ion-implanted at an acceleration voltage of 60 keV and a dose of $1 \times 10^{12}$ cm$^{-2}$, using film 102, and electrodes 104a, 104b and 107 as masks (FIG. 11F). 500-Å thick oxide film 108 was then grown around electrode 107 by performing thermal oxidation at a temperature of 900° to 1000° C. in an oxidizing atmosphere. At this time, the arsenic and phosphorus which were ion-implanted in the steps shown in FIGS. 11D and 11F were activated to form n-type impurity diffusion layers 109, 110, 121, and 122 in the surface of substrate 101. Since the dose of arsenic implanted in the steps mentioned above was a large one, high concentration diffusion layers 109, 110a, 121a, and 122a were formed. Since the dose of phosphorus implanted was a comparatively small one, low concentration diffusion layers 110b, 121b, and 122b were formed (FIG. 11G). After depositing SiO$_2$ film 111 over the entire surface of the resultant structure using a CVD method and opening contact holes 112 therein, an Al film was deposited and patterned to form Al electrodes 113, 114, 123, and 124. This completed the preparation of an EPROM memory cell and a MOS transistor (FIGS. 11H and 12). FIG. 12 is a plan view corresponding to the sectional view of FIG. 11H.

With the manufacturing process of Example 6, it is possible to manufacture at the same time an EPROM memory cell and a normal MOS transistor (without floating gate electrode 107) together on the same chip. In addition, the area of layer 110 near the channel region, which is not on the side of electrode 107, becomes low concentration diffusion layer 110b in the EPROM memory cell. In the MOS transistor, the area of layers 121 and 122 (forming the source and drain regions) near the channel region is formed by low concentration diffusion layers 121b and 122b. A structure of this type can reduce variations in the threshold voltage and improve reliability by decreasing the channel length.

As channel length decreases, however, the threshold voltage of the channel region becomes lower, resulting in the so-called short channel effect.

Another effect of the reduction of channel length is a strengthening of the electric field in the channel region caused by the voltage applied between the source and drain regions, and a consequent increase in the probability of impact ionization occurring. Some of the electrons and holes generated by impact ionization can break through the energy barrier between the semiconductor substrate and the gate insulating film and be injected into the gate insulating film, from which they can flow to the gate electrode and cause a gate current. Some of the electrons and holes injected into the gate insulating film and trapped therein and can cause variations in transistor operation characteristics such as threshold voltage or channel conductance, thus impairing the reliability of the device.

In the semiconductor device of Example 6, since low concentration diffusion layers 110b, 121b, and 122b are present in the source and drain region portions adjacent the channel region, some of the voltage components applied between the source and drain regions can be maintained by these layers, and it is possible to attenuate the electric field which becomes especially concentrated in the channel region near the drain region.

It is simple to construct in the manner of Example 6 a semiconductor device having both an EPROM memory cell, having superior write efficiency and free of unintentional writing, and a high reliability MOS transistor constituting a peripheral circuit.

In Example 6, the n-type diffusion layer of the EPROM on the side where the floating gate electrode is not present is constituted by the low concentration diffusion layer near the channel region. Similarly, the n-type diffusion layer of the transistor at the source side near the channel region is also constituted by the low concentration diffusion layer. Such low concentration diffusion layers normally do not cause a significant problem in device operation, but since they act as resistors connected in series between the source and drain, they can effectively cause a drop in the voltage applied between the source and the drain, thus resulting in, for example, lower write efficiency and the like. In this case, by removing in advance (before the step shown in FIG. 11D) residual polysilicon 106' from the portions in which it is not desirable to form a low concentration diffusion layer, it is possible to prevent the formation of such layers. Even when such a method is used, however, there are cases where high concentration diffusion layers formed by phosphorus will be formed by the difference in thermal diffusion coefficients between the ion-implanted arsenic and phosphorus. In order to prevent this phenomenon, it is necessary to activate the implanted arsenic ions by performing sufficient annealing between the steps of high concentration impurity implantation (FIG. 11D) and low concentration impurity implantation (FIG. 11F) to form a high concentration diffusion layer to collect the phosphorus diffused by annealing after the step shown in FIG. 11F.

In Examples 1 to 6, a description was given for the case of an n-channel memory cell, but the present invention is not limited to this case and can be applied equally effectively to the manufacture of a p-channel cell.

What is claimed is:

1. A semiconductor device, comprising:
a semiconductor substrate of a first conductivity type having a surface region;
a first impurity diffusion region of a second conductivity type, formed in said surface region of said semiconductor substrate;
a second impurity diffusion region of the second conductivity type, formed in said surface region of said semiconductor substrate and separated from said first impurity diffusion region;
a first insulating film formed on said surface region of said semiconductor substrate between said first and second impurity diffusion regions;
a floating gate electrode formed on a first portion of said first insulating film and overlaying a first portion of said semiconductor substrate;
a control gate electrode formed on a second portion of said first insulating film and overlaying in its entirety a second portion of said semiconductor substrate separate from said first substrate portion; and
a second insulating film interposed between said floating gate electrode and said control gate electrode;
said floating gate electrode being positioned laterally closer to said first impurity diffusion region than to said second impurity diffusion region, and said control gate electrode being positioned laterally closer to said second impurity diffusion region than to said first impurity diffusion region.

2. A device according to claim 1, wherein a third impurity diffusion region, of the second conductivity type and having a lower impurity concentration than said second impurity diffusion region, is formed adjacent to the side of said second impurity diffusion region which is opposite to said first impurity diffusion region.

3. A semiconductor device according to claim 1, wherein a fourth impurity diffusion region, of the first conductivity type and having a higher impurity concentration than said semiconductor substrate, is formed below said floating gate electrode and adjacent to said first impurity diffusion region.

4. A device according to claim 1, wherein a fifth impurity diffusion region, added with an impurity of the second conductivity type, is formed below said floating gate and adjacent to said first impurity diffusion region.

5. A device according to claim 4, wherein a sixth impurity diffusion region, of the first conductivity type and having a higher impurity concentration than said semiconductor substrate, is formed adjacent to said fifth impurity diffusion region and opposite to said second impurity diffusion region.

6. A device according to claim 1, wherein said floating gate electrode is disposed in such proximity to said first impurity diffusion region that charge carriers are injected into said floating gate electrode during a write operation in which a first potential is applied between said second impurity diffusion region and said control gate electrode and wherein said floating gate electrode is so separated from said second impurity diffusion region that charge carriers are not injected into said floating gate electrode during a read operation in which a second potential lower than said first potential is applied between said first impurity diffusion region and said control gate electrode.

* * * * *